(12) United States Patent
Grayzel (10) Patent No.: US 11,223,331 B1
(45) Date of Patent: Jan. 11, 2022

(54) HIGH EFFICIENCY AND HIGH POWER LINEAR AMPLIFIER

(71) Applicant: Alfred Ira Grayzel, Park City, UT (US)

(72) Inventor: Alfred Ira Grayzel, Park City, UT (US)

(*) Notice: Subject to any disclaimer, the term of this patent is extended or adjusted under 35 U.S.C. 154(b) by 0 days.

(21) Appl. No.: 17/356,407

(22) Filed: Jun. 23, 2021

(51) Int. Cl.
*H03F 3/191* (2006.01)
*H03F 3/193* (2006.01)
*H03F 1/32* (2006.01)
*H03F 1/56* (2006.01)
*H03F 3/16* (2006.01)

(52) U.S. Cl.
CPC ........... *H03F 1/3205* (2013.01); *H03F 1/565* (2013.01); *H03F 3/16* (2013.01); *H03F 2200/387* (2013.01)

(58) Field of Classification Search
CPC ... H03F 3/04; H03F 3/16; H03F 3/191; H03F 3/193; H03F 1/56; H03F 2200/541
USPC .................. 330/195, 277, 296, 302
See application file for complete search history.

(56) References Cited

U.S. PATENT DOCUMENTS

| | | | | |
|---|---|---|---|---|
| 5,670,911 A | * | 9/1997 | Hori | H03F 1/0238 330/277 |
| 6,134,424 A | * | 10/2000 | Nishihori | H01L 29/0891 257/280 |
| 2010/0188153 A1 | * | 7/2010 | Woo | H03F 1/56 330/277 |

* cited by examiner

*Primary Examiner* — Steven J Mottola
(74) *Attorney, Agent, or Firm* — Workman Nydegger (57) ABSTRACT

An amplifier includes a Field Effect Transistor (FET) or a Bipolar Junction Transistor (BJT) with "hard saturation."; where the FET or the BJT to has a nearly constant drain or collector current when the drain or collector voltage is greater than the pinchoff voltage. The amplifier further includes a bias network, configured to provide a DC voltage to the FET or the BJT, a means for isolating the DC voltage from the matching network, an electrical load, and a matching network which transforms the electrical load to a resistance between the drain and the source or the collector and emitter which causes the drain or collector voltage to be greater than the pinchoff voltage over the entire cycle of the sinusoidal voltage applied to the gate, whereby the amplifier is linear.

18 Claims, 5 Drawing Sheets

HIGH EFFICIENCY AND HIGH POWER LINEAR AMPLIFIER

BACKGROUND OF THE INVENTION

The present invention relates to linear high efficiency and high power field-effect transistor (FET) amplifiers. In prior art, at least two FETs are used. One EFT is for high power, and another one is to achieve improved linearity. Such configurations include an architecture of the predistortion linearizing technique, an architecture of the Dougherty Amplifier, and the architecture of the "out-phasing" technique, each of which requires trade-offs between efficiency and linearity and require at least two FETs.

SUMMARY OF THE INVENTION

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

The embodiments described herein are related to an improved linear high efficiency and high-power FET or BJT (Bipolar Junction Transistor) power amplifier. In particular, amplifiers according to the present invention offer advantages over known amplifiers by (1) being linear, (2) having high efficiency (e.g., that can be greater than 60%), (3) operating at or near the maximum output power of the FET or BJT when the input voltage is sinusoidal and (4) requiring only a single transistor.

Amplifiers according to the present invention to achieve linearity utilize:

(1) FETs or BJTs with "hard saturation" where a "hard saturation" FET or BJT has a nearly constant drain or collector current when the drain or collector voltage is greater than the pinchoff voltage Vdsat; the value of the drain or collector voltage where the drain or collector current first saturates.

(2) Combinations of bias voltage and load resistance such that the drain voltage is greater than the pinchoff voltage and less than the breakdown voltage Vb of the FET or BJT over the entire cycle. The breakdown voltage Vb is the value of the drain voltage, which causes the FET or BJT to break down. These combinations achieve high output power, high efficiency, and linear amplification.

(3) Impedance transforming networks present a load resistance that maintains the drain voltage greater than Vdsat over the entire cycle for a given value of bias voltage.

The present invention also relates to amplifiers where the FET or BJT does not have "hard saturation." In that case, the amplifier will deviate from linearity to the extent that the FET or BJT deviates from "hard saturation." The deviation from linearity will be minimized when combinations of bias voltage and load resistance are such that the drain or collector voltage is greater than Vdsat and less than the breakdown voltage of the FET or BJT over the entire cycle.

Additional features and advantages of exemplary implementations of the invention will be set forth in the description which follows, and in part will be obvious from the description, or may be learned by the practice of such exemplary implementations. The features and advantages of such implementations may be realized and obtained by means of the instruments and combinations particularly pointed out in the appended claims. These and other features will become more fully apparent from the following description and appended claims or may be learned by the practice of such exemplary implementations as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not, therefore, to be considered to be limiting in scope, embodiments will be described and explained with additional specificity and details through the use of the accompanying drawings in which.

DETAILED DESCRIPTION

Figure 1:
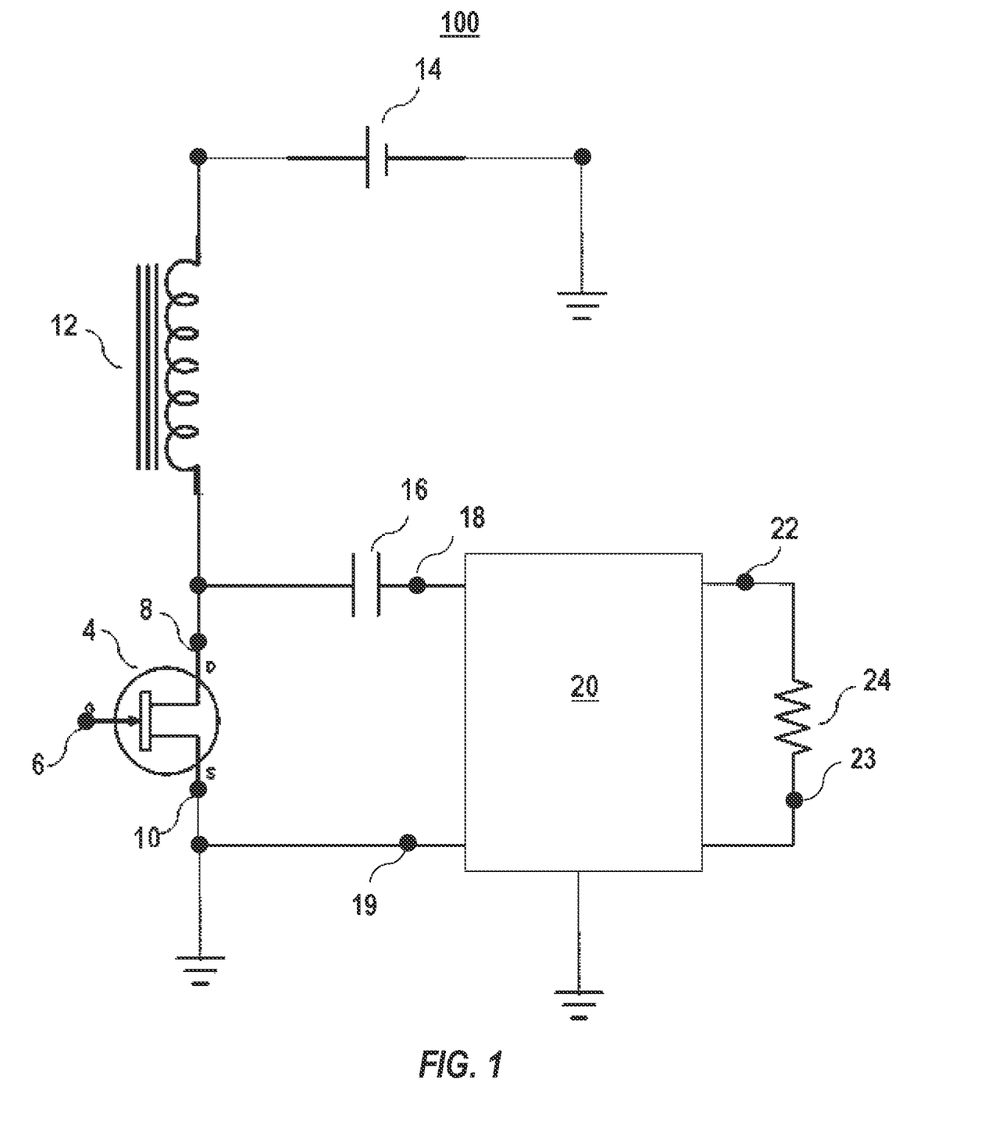
FIG. 1 shows an example embodiment of an FET amplifier that embodies the principles described herein, the FET amplifier utilizing a linear impedance transforming network which, for a given value of bias voltage, presents a load resistance that maintains the drain voltage greater than Vdsat over the entire cycle.

FIG. 1 shows a schematic of a field effect transistor (FET) amplifier 100 according to the present invention. The amplifier comprises a "hard saturation" FET 4 with a gate terminal 6, a drain terminal 8, and a source terminal 10 which is connected to ground. The FET 4 has a hard saturation in which a drain current flowing through the drain terminal 8 is substantially constant when a drain voltage that is a voltage from the drain terminal 8 to the source terminal 10 is greater than a saturation voltage. The saturation voltage is a voltage at which pinchoff first occurs.

In some embodiments, the FET is selected from a family of FETs comprising an n-type JFET, p-type JFET, MESFET, MOSFET, NMOSFET, PMOSFET NMOSFET, MNOSFET, DIGMOSFET, HIGFET, TFET, HEMPT, or CMOSFET. In some embodiments, the FET is an enhancement type of transistor, or a depletion mode type of transistor.

The FET amplifier 100 includes a bias network configured to provide a DC voltage $V_0$ from the drain terminal to the source terminal. The FET 4 is biased with a voltage $V_0$ by a DC battery 14 with voltage $V_0$, connected through an RF choke 12 to drain terminal 8. An impedance transforming network 20, having two input terminals 18 and 19. Input terminal 18 is connected through a blocking capacitor 16 to the drain terminal 8 and input terminal 19 is connected to the source terminal 10. The matching network also has two output terminals 22 and 23, each of which is connected to one of the two input terminals of the electrical load resistor 24. The matching network is configured to present an impedance between the drain terminal 8 and the source terminal 10, such that when a sinusoidal voltage is applied between the gate terminal and the source terminal, the drain voltage is maintained at a voltage that is greater than the saturation voltage over an entire cycle of the sinusoidal voltage.

The impedance transforming network 20 performs the following:

1. Transforms the load resistance 24 to a value of resistance Rin at its input terminal of matching network 18, which for a given value of $V_0$ maintains the drain voltage greater than or equal to Vdsat over the entire cycle.
2. Does not allow current at the harmonic frequencies to flow through load resistance 24.
3. Does not allow current at the harmonic frequencies to be of sufficient magnitude to cause the drain voltage to be less than Vdsat or greater than the breakdown voltage of the FET, over any portion of the cycle. Shorting the second harmonic will, in theory, satisfy this condition but is not necessarily required.

The amplifier shown in FIG. 1 operates as follows. When the FET 4 is a JFET, and the drain voltage is greater than or equal to Vdsat, a very good approximation for the drain current is given by Equation (1) below:

$$Ids = Idss(1 - Vg/Vp)^2 \quad \text{Equation (1)}$$

where Vg is the gate voltage, Idss is the drain current when Vg=0, Vp is the pinchoff voltage, and Vdsat is the drain voltage, at which pinchoff first occurs. When Vg is sufficiently negative, the channel between the drain terminal 8 and source terminal 10 is pinched off. When the gate voltage Vg is given by Equation (2), using the approximation of Equation (1), Ids/Idss is given by Equation (3) as follows:

$$Vg = (Vp/2)(1 - K\cos(\omega t)) \quad \text{Equation (2)}$$

$$Ids/Idss = (2+K^2)/8 + (1/2)K\cos(\omega t) + (K^2/8)\cos(2\omega t) \quad \text{Equation (3)}$$

When K=1, for an n-type JFET where Vp<0 Vg has a maximum value of 0 and a minimum value of Vg.

When the FET 4 is a JFET, the drain voltage at the fundamental frequency is given by Equation (4) below.

$$Vd = K(1/2)\cos(\omega t)Rin \quad \text{Equation (4)}$$

It can be seen from Equation (2) and Equation (4) that for K≤1 that when the gate voltage is a sinusoid proportional to K, the drain voltage is a sinusoid proportional to K, and the amplifier is linear.

When the FET 4 is a MOSFET and the drain voltage is greater than or equal to Vdsat; using the square law theory, Idsat is given by Equation (5) below.

$$Idsat = (Z\mu'n\, C0/2L)(Vg - VT)^2 \quad \text{Equation (5)}$$

where µ'n is the average mobility of the inversion layer carriers, C0 is the oxide capacitance, Z is the width of the channel, L is the length of the channel, VT is the threshold voltage, and Vdsat is the drain voltage Vd, at which pinchoff occurs.

When the gate voltage is given by Equation (6) below, $$Vg = (Vgmax + VT)/2 + K[(Vgmax - VT)/2]\cos(\omega t) \quad \text{Equation (6)}$$

where Vgmax is the maximum gate voltage and when K=1 Vg is sinusoidal with a maximum value of Vgmax and a minimum value of VT. Idsat/Idss is then given by Equation (7) below where Idss is the drain saturation current when the gate voltage equals Vgmax.

$$Idsat/Idss = (2+K^2)/8 + (1/2)K\cos(\omega t) + (K^2/8)\cos(2\omega t) \quad \text{Equation (7)}$$

When the FET 4 is a MOSFET, the drain voltage at the fundamental frequency is given by Equation (8) below.

$$Vd = K(1/2)\cos(\omega t)Rin \quad \text{Equation (8)}$$

It can be seen from Equation (6) and Equation (8) that for K≤1 that when the gate voltage is a sinusoid proportional to K, the drain voltage is a sinusoid proportional to K and the amplifier is linear.

When the drain voltage is greater than or equal to Vdsat over the entire cycle, it can be seen from Equation (1) and from Equation (5) that the drain current Idsat is a quadratic function of the gate voltage. Since there are no third order or higher terms, there are no third order or higher intermodulation products. Equation (1) and Equation (5), however, only apply to FETs or BJTs with "hard saturation". If the drain voltage is less than Vdsat or the FET or BJT does not have "hard saturation" the drain current or collector current is a function of both the gate voltage and the drain voltage, and the amplifier deviates from linearity.

The present invention also applies to FETs that do not have "hard saturation" The condition that the drain voltage is greater than Vdsat and less than the breakdown voltage Vb over the entire cycle will minimize the deviation from linearity for FETs or BJTs that do not have "hard saturation." In this case, the drain or collector current is only a function of the drain or collector voltage to the extent that the drain or collector current deviates from "hard saturation."

The present invention utilizes combinations of bias voltage and load resistance such that the drain voltage is greater than Vdsat and less than the breakdown voltage Vb over the entire cycle. This is most easily accomplished by short-circuiting the harmonic voltages to ground so that the harmonic voltages do not cause the drain voltage to violate this condition.

When the harmonics are all shorted to ground, the condition for the drain voltage being greater than Vdsat over the entire cycle is given by the inequality of Equation (9a) for a JFET and Equation (9b) for a MOSFET.

$$V0 \geq (Idss/2)Rin + |Vp| \quad \text{Equation (9a)}$$

$$V0 \geq (Idss/2)Rin + (V_{gmax} - V_T) \quad \text{Equation (9b)}$$

where V0; is the DC voltage applied to the drain, Rin is the resistance value presented to the FET or BJT at the drain. The greatest efficiency is achieved when for a JFET Equation (9a) is satisfied with the equal sign, and for a MOSFET, Equation (9b) is satisfied with the equal sign. The amplifier shown in FIG. 1, according to the present invention, is biased by the DC battery 14 with DC voltage V0. Rin is then given by Equation (10a) for a JFET and Equation (10b) for a MOSFET as follows:

$$Rin = (V_0 - |Vp|/(I_{dss}/2) \quad \text{Equation (10a)}$$

$$Rin = (V_0 - (V_{gmax} - V_T)|)/(I_{dss}/2) \quad \text{Equation (10b)}$$

The efficiency of the amplifier increases when V0 increase, and therefore Rin increases. To avoid breakdown of the FET the inequality, Equation (11a) for a JFET and Equation (11b) for a MOSFET below are generally required to be satisfied.

$$Rin \leq (Vb - |Vp|/Idss \quad \text{Equation (11a)}$$

$$Rin \leq (Vb - (V_{gmax} - V_T))/I_{dss} \quad \text{Equation (11b)}$$

In some embodiments, the matching network comprises a reactance network and a transformer. The reactance network presents a short circuit or a virtual short circuit between the drain terminal and the source terminal at one or more harmonic frequencies, and the transformer transforms the resistance of the electrical load to a second resistance at the two input terminals of the matching network. The second resistance is configured to maintain the drain voltage to be greater than the saturation voltage over the entire cycle of the sinusoidal voltage that is applied between the gate terminal and the source terminal.

Figure 2:
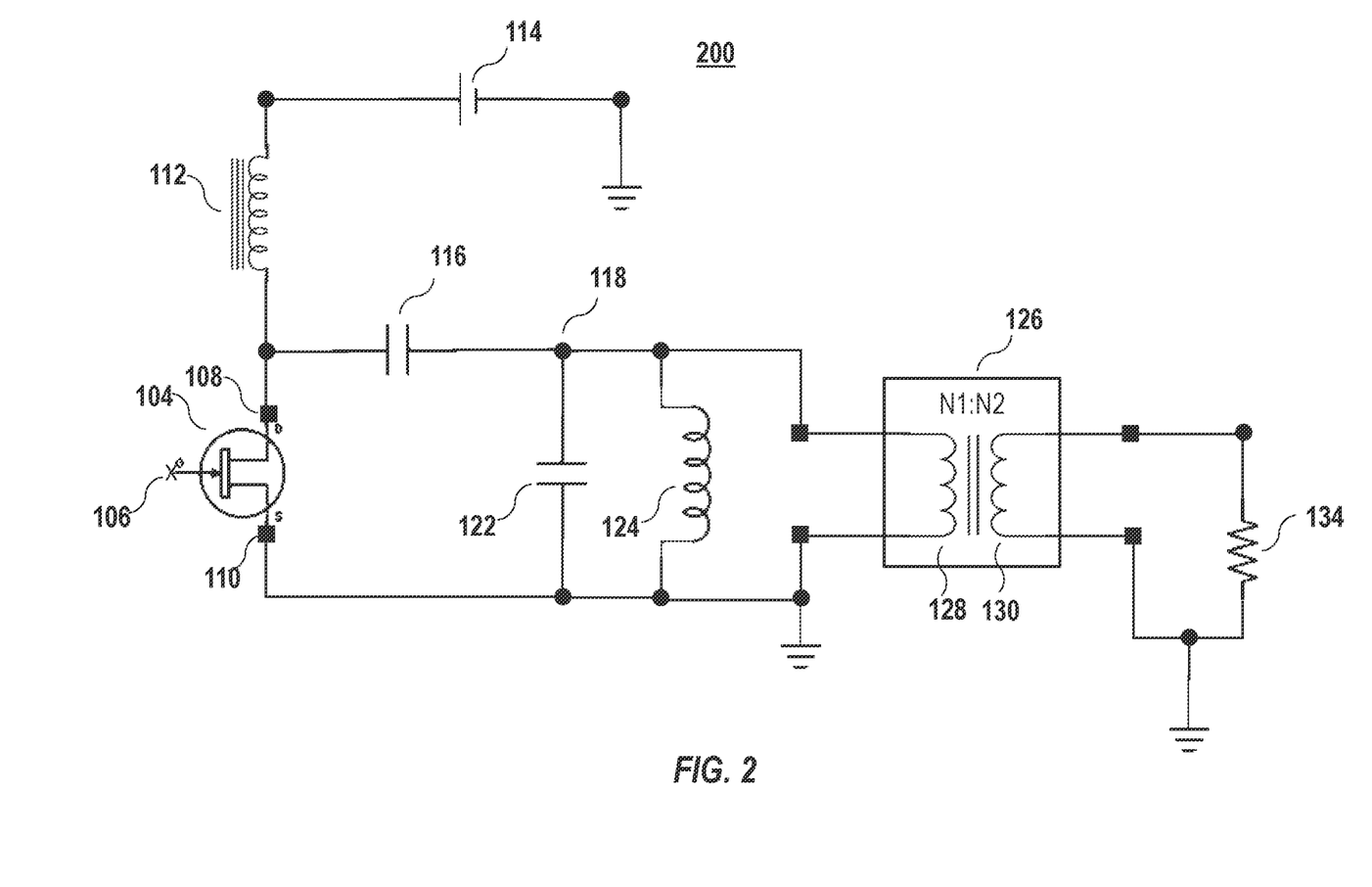
FIG. 2 shows another example embodiment of an FET amplifier that embodies the principles described herein, the FET amplifier utilizing a transformer and a shunt resonator which is an open circuit at the fundamental frequency and a virtual short circuit at the second harmonic.

FIG. 2 shows an example embodiment of an FET amplifier 200 (which corresponds to the FET amplifier 100 of FIG. 1), in which a matching network includes a reactance network 118 and a transformer 126. The amplifier comprises "hard saturation" FET 104 with a gate terminal 106, a drain terminal 108, and a source terminal 110, which is connected to ground. The FET 104 is biased with a voltage $V_0$ by a DC battery 114, with voltage $V_0$, connected through an RF choke 112 to drain terminal 108. The drain terminal 108 is connected through a blocking capacitor 116 to a reactance network 118, which is in shunt to ground. The reactance network 118 comprises a capacitor 122 in parallel with an inductor 124. The values of capacitor 122 and inductor 124 are chosen to present an open circuit at the fundamental frequency, and a Q of the resultant resonator sufficiently large to present a virtual short circuit at the second harmonic. The reactance network 118 is connected to the primary winding 128 of a transformer 126 comprising a primary winding 128 with N1 turns and a secondary winding 130 with N2 turns where N1 and N2 are chosen to present to the output of the FET 104 the required value of resistance such that the drain voltage Vdis greater than Vdsat over the entire cycle, where N1 and N2 are both natural numbers. The secondary winding 130 is connected to a load resistor RL 134. As such, the transformer is configured to transform the resistance of the electrical load (e.g., the value $(N1/N2)^2 RL$ ohms.

As illustrated, FIG. 2 is an example of the circuit configuration of FIG. 1, where the linear impedance transforming network 20 is realized by a reactance network 118, which presents an open circuit at the fundamental frequency and a virtual short circuit at the second harmonic. The reactance network 118 is connected to the primary winding 128 of a transformer which transforms the load resistor 134 to the required resistance Rin given by Equation (10a) and/or Equation (10b) and which generally satisfy Equation (11a) and/or Equation (11b).

Figure 3:
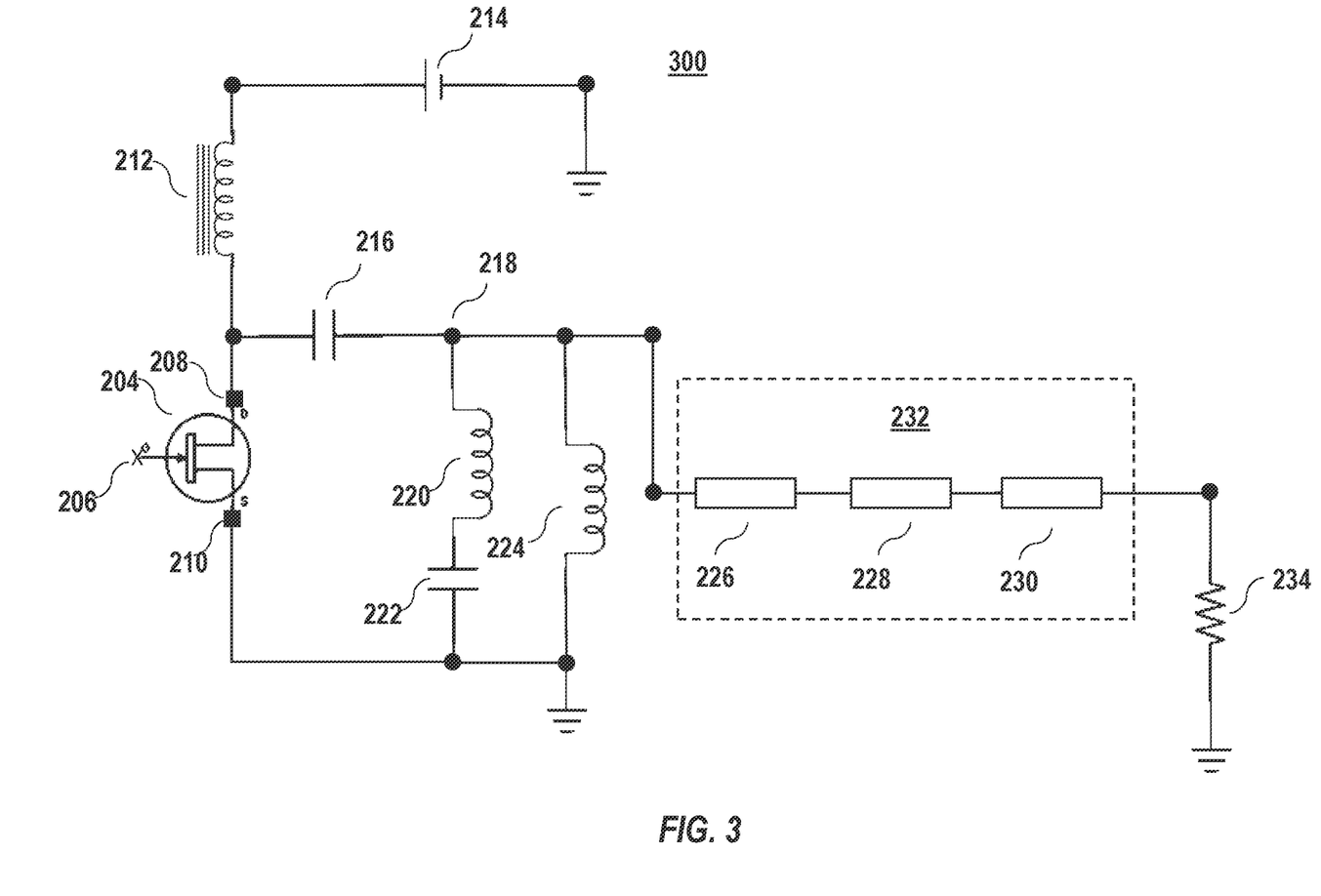
FIG. 3 shows another example embodiment of an FET amplifier that embodies the principles described herein, the FET amplifier utilizing a quarter-wave transmission line transformer and a shunt resonator which is an open circuit at the fundamental frequency and a short circuit at the second harmonic.

FIG. 3 shows an example embodiment of an FET amplifier 300 (which corresponds to the FET amplifier 100 of FIG. 1) having an N section quarter-wave transmission line transformer, where N=3. The amplifier comprises "hard saturation" FET 204 with a gate terminal 206, a drain terminal 208, and a source terminal 210, which is connected to ground. The FET 204 is biased with a voltage $V_0$ by a DC battery 214, with voltage $V_0$ connected through an RF choke 212 to drain terminal 208. The drain is connected through a blocking capacitor 216 to a reactance network 218, which is shunted to ground. The reactance network 218 comprises a series resonator comprising an inductor 220 and a capacitor 222 in parallel with an inductor 224. The values of inductor 220, capacitor 222, and inductor 224 are chosen to present an open circuit at the fundamental frequency and a short circuit at the second harmonic. In some embodiments, the reactance network 218 is connected to a homogeneous N section quarter-wave transformer 232. In FIG. 3, N=3 for this example. The quarter-wave transformer 232 is connected to a load resistor 234. The three quarter-wave transmission lines 226, 228, and 230 transform the load resistor 234 (having a resistance RL) to the required resistance Rin given by Equation (10a) and/or Equation (10b) and which generally satisfy Equation (11a) and/or Equation (11b).

As illustrated, FIG. 3 is an example of the circuit configuration of FIG. 1, where the linear impedance transforming network 20 is realized by a reactance network 218, which presents an open circuit at the fundamental frequency and a short circuit at the second harmonic. The reactance network 218 is connected to the N section quarter-wave transformer 232; N=3 for the example in FIG. 3, which transforms the load resistor 234 to the required resistance Rin given by Equation (10a) and/or Equation (10b) and which generally satisfy Equation (11a) and/or Equation (11b).

Figure 4:
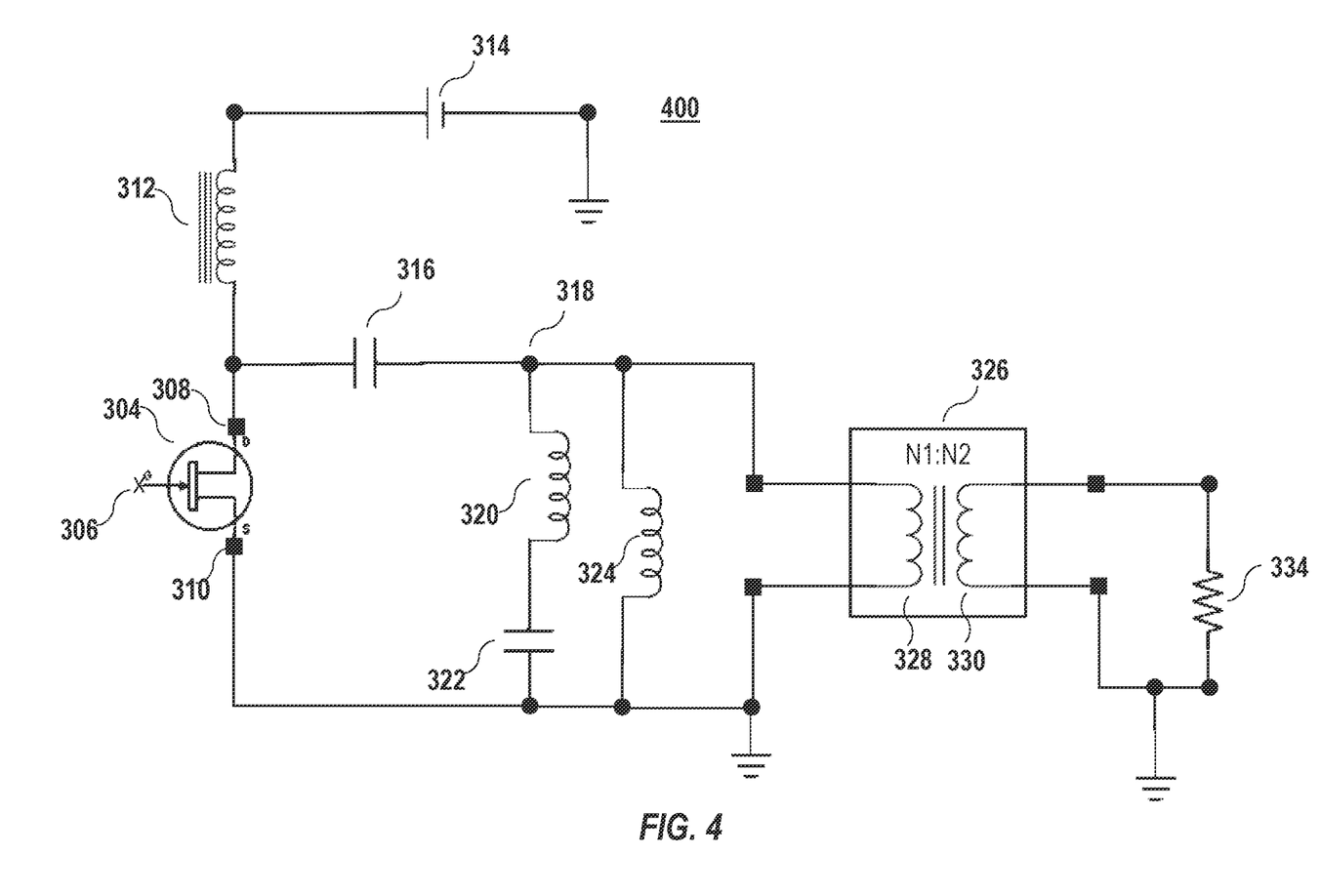
FIG. 4 shows another example embodiment of an FET amplifier that embodies the principles described herein, the FET amplifier utilizing a transformer and a shunt resonator which is an open circuit at the fundamental frequency and a short circuit at the second harmonic.

FIG. 4 shows another example embodiment of an FET amplifier 400 (which corresponds to the FET amplifier 100 of FIG. 1). The amplifier comprises a "hard saturation" FET 304 with a gate terminal 306, a drain terminal 308, and a source terminal 310 connected to ground. The FET 304 is biased with a voltage $V_0$ by a DC battery 314 with voltage $V_0$, connected through an RF choke 312 to drain terminal 308. The drain is connected through a blocking capacitor 316 to a reactance network 318, which is in shunt to ground. The reactance network 318 comprises a series resonator comprising an inductor 320 in series with a capacitor 322, where this resonator is connected in parallel with an inductor 324. The reactance network 318 is connected to the primary winding 328 of a transformer 326, comprising a primary winding 328 with N1 turns and a secondary winding 330 with N2 turns. The secondary winding 330 is connected to a load resistor 334.

As illustrated, FIG. 4 is another example of the circuit configuration of FIG. 1, where the linear impedance transforming network 20 is realized by a reactance network 318. In some embodiments, the reactance network 318 is connected to the primary winding 328 of a step-up transformer, which transforms the load resistor 334 to the required resistance Rin given by Equation (10a) and/or Equation (10b) and which generally satisfy Equation (11a) and/or Equation (11b).

Figure 5:
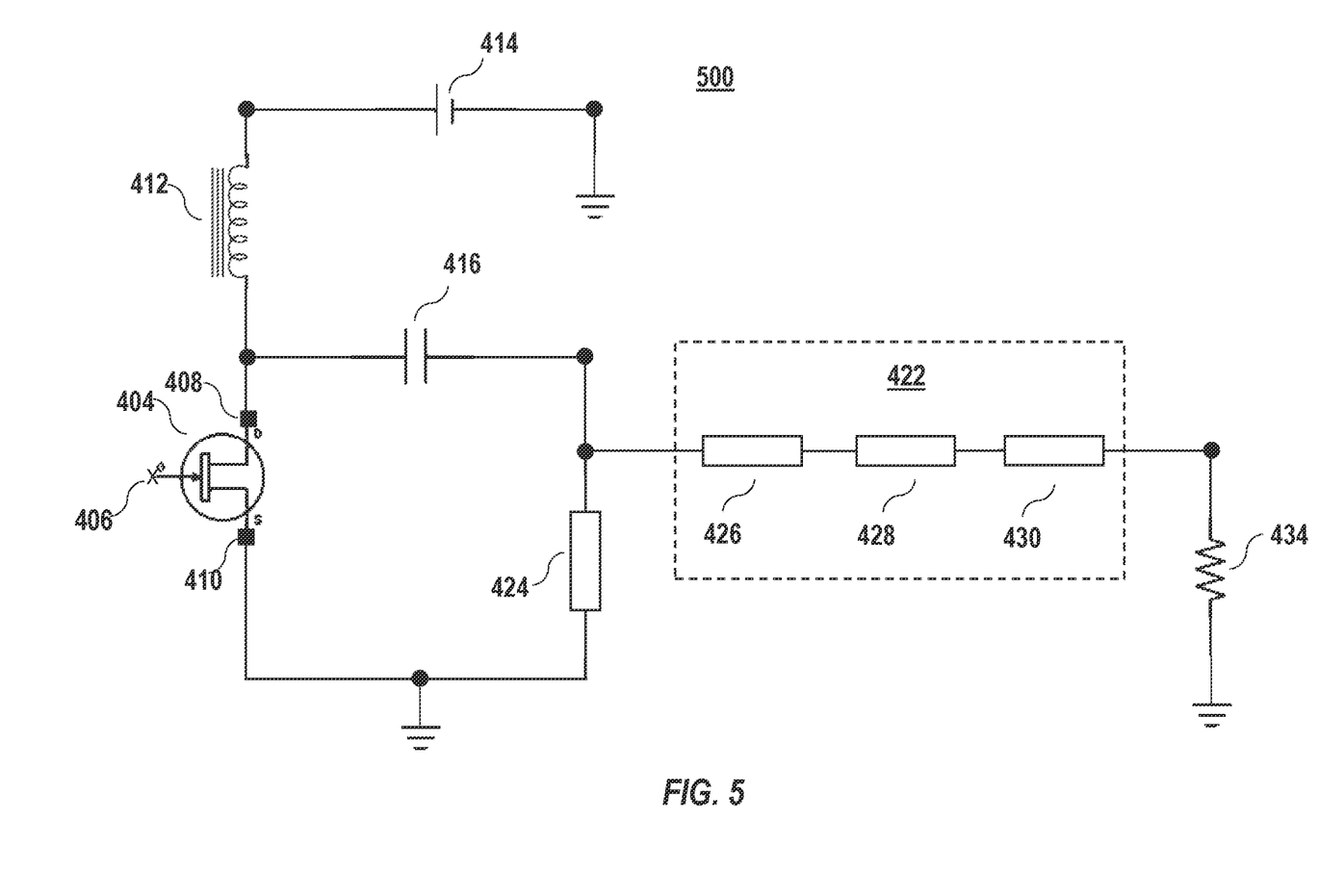
FIG. 5 shows another example embodiment of an FET amplifier that embodies the principles described herein, the FET amplifier utilizing an N section quarter-wave transmission line transformer and a shunted quarter wavelength short-circuited transmission line.

FIG. 5 shows another example embodiment of an FET amplifier 500 (which corresponds to the FET amplifier 100 of FIG. 1). The amplifier comprises "hard saturation" FET 404 with a gate terminal 406, a drain terminal 408, and a source terminal 410 which is connected to ground. The FET 404 is biased with a voltage $V_0$ by a DC battery 414, with voltage $V_0$ connected through an RF choke 412 to drain terminal 408. The drain terminal 408 is connected through a blocking capacitor 416 to both a homogeneous N section quarter-wave transformer 422 and to a quarter wavelength short-circuited transmission line 424. Each section of the homogeneous N section quarter-wave transformer 422 is a quarter wavelength long at the fundamental frequency. In FIG. 5, N=3 for this example. The quarter-wave transformer 422 comprises three quarter-wave transmission lines 426, 428, and 430. The quarter-wave transformer 422 is connected to a load resistor 434.

As illustrated, FIG. 5 is another example of the circuit configuration of FIG. 1, where the linear impedance transforming network 20 is realized by the quarter wavelength short-circuited transmission line 424 and the transformer 422. The quarter wavelength short-circuited transmission line 424 presents an open circuit at the fundamental frequency and a short circuit at the second harmonic. Only the second harmonic needs to be short-circuited to ground, since, as can be seen from Equation (3) and/or Equation (7), only the second harmonic is present. The reactance network 418 is connected to the N section quarter-wave transformer 422; N=3 for the example in FIG. 5, the three sections quarter-wave transformer transforms the load resistor 434 to the required resistance Rin given by Equation (10a) and/or Equation (10b) and which generally satisfy Equation (11a) and/or Equation (11b).

As an example consider the embodiment of the present invention shown in FIG. 1 where the FET is a MOSFET with Vb=7, Vgmax=4, VT=1, ZL=50 and Idss=(2.8)/1000. Equation (10b) yields Rin<2142 and Rin/ZL<42.84. To satisfy Equation (10b) with the equal sign, $N1/N2=(42.84)^{1/2}=6.545$.

Various means can be used to connect terminals, segments voltage sources, and/or biasing networks. In at least one embodiment, such means for connecting can comprise traces, wires, resistive components, capacitive components, inductive components, or any other conductive component. Additionally, as used herein, a biasing network comprises one or more circuit components that deliver a voltage between the drain and the source.

The present invention is applicable to any FET such as but not limited to n-type JFET, p-type JFET, MOSFET, NMOSFET, PMOSFET, CMOSFET, DIGMOSFET, HIGFET, TFET, and HEMPT, in the enhancement mode and in the depletion mode and FETs with multiple channels with multiple gates where one or more of the gates is divided into segments as described above.

Even though an FET transistor is shown in the drawings and the descriptions above, the principles described herein are also applicable to Bipolar Junction Transistors (BJT). A BJT has a base terminal, an emitter terminal, and a collector terminal. In some embodiments, the BJT has a hard saturation, in which a collector current flowing through the collector terminal is substantially constant when a collector voltage that is a voltage from the collector terminal to the emitter terminal is greater than a saturation voltage. The saturation voltage is a voltage at which pinchoff first occurs. Based on the above descriptions of FET amplifiers with respect to FIGS. 1-5, an ordinary person in the art would understand that a similar circuitry network may be implemented using a BJT having a hard saturation.

Further, the principles described herein are also applicable to amplifiers where the FET or BJT does not have "hard saturation". In that case, the amplifier will deviate from linearity to the extent that the FET or BJT deviates from "hard saturation". The deviation from linearity will be minimized when combinations of bias voltage and load resistance are such that the drain or collector voltage is greater than Vdsat and less than the breakdown voltage of the FET or BJT over the entire cycle. Based on the above descriptions of FET amplifiers with respect to FIGS. 1-5, an ordinary person in the art would also understand that a similar circuitry network may be implemented using an FET or BJT that does not have hard saturation, but deviates from hard saturation.

Further Example Embodiments

Following are further examples of embodiments of the invention. These are presented only by way of example and are not intended to limit the scope of the invention in any way.

Embodiment One. An amplifier comprises a Field Effect Transistor (FET), a bias network, an electrical load, and a matching network. The FET has a gate terminal, a source terminal, and a drain terminal. The FET has hard saturation in which a drain current flowing through the drain terminal is substantially constant when a drain voltage that is a voltage from the drain terminal to the source terminal is greater than a saturation voltage. The saturation voltage is a voltage at which pinchoff first occurs. The bias network is configured to provide a DC voltage from the drain terminal to the source terminal. The electrical load has a resistance of a valve RL ohms. The electrical load has two input terminals. The matching network has two input terminals and two output terminals. One of the input terminals is connected to the drain terminal and the other input terminal is connected to the source terminal. Each of the output terminals is connected to one of the two input terminals of the electrical load. The matching network is configured to present an impedance at the drain terminal and the source terminal, such that when a sinusoidal voltage is applied between the gate terminal and the source terminal, the drain voltage is maintained at a voltage that is greater than the saturation voltage over an entire cycle of the sinusoidal voltage. The amplifier further comprises a means for isolating the DC voltage from the matching network, such that the drain current is not a function of the drain voltage and is a linear function of the sinusoidal voltage applied between the gate terminal and the source terminal.

Embodiment Two. The amplifier in embodiment one, wherein the matching network comprises a reactance network and a transformer. The reactance network presents a short circuit or a virtual short circuit between the drain and the source at one or more harmonic frequencies. The transformer transforms the resistance of the electrical load to a second resistance at the two input terminals of the matching network. The second resistance is configured to maintain the drain voltage to be greater than the saturation voltage over the entire cycle of the sinusoidal voltage that is applied between the gate terminal and the source terminal.

Embodiment Three. The amplifier in embodiments one and/or two, wherein the transformer has a primary winding of N1 turns and a secondary winding of N2 turns configured to transform the resistance of the electrical load to the second resistance of value $(N1/N2)^2 RL$ ohms, where N1 and N2 are natural numbers.

Embodiment Four. The amplifier in embodiments one and/or two, wherein the transformer is an N section quarter-wave transmission line transformer configured to transform the resistance of the electrical load to the second resistance, where N is a natural number.

Embodiment Five. The amplifier in embodiments one through three, wherein the FET is from a family of FETs comprising an n-type JFET, p-type JFET, MESFET, MOSFET, NMOSFET, PMOSFET NMOSFET, MNOSFET, DIGMOSFET, HIGFET, TFET, HEMPT, or CMOSFET. The FET is an enhancement type of transistor, or a depletion mode type of transistor.

Embodiment Six. An amplifier comprises a Bipolar Junction Transistor (BJT), a bias network, an electrical load, and a matching network. The BJT has a base terminal, an emitter terminal, and a collector terminal. The BJT has hard saturation, in which a collector current flowing through the collector terminal is substantially constant when a collector voltage that is a voltage from the collector terminal to the emitter terminal is greater than a saturation voltage. The saturation voltage is a voltage at which saturation first occurs. The bias network is configured to provide a DC voltage from the collector terminal to the emitter terminal. The electrical load has a resistance of value RL ohms. The electrical load has two input terminals. The matching network has two input terminals and two output terminals. One of the two input terminals is connected to the collector terminal, and the other input terminal is connected to the emitter terminal. Each of the output terminals is connected to one of the two input terminals of the electrical load. The matching network is configured to present an impedance at the collector terminal and the emitter terminal, such that when a sinusoidal voltage is applied between the base terminal and the emitter terminal, the collector voltage is maintained at a voltage that is greater than the saturation voltage over an entire cycle of the sinusoidal voltage. The amplifier further comprises a means for isolating the DC voltage from the matching network, such that the collector current is not a function of the collector voltage and is a linear function of the sinusoidal voltage applied between the base terminal and the emitter terminal.

Embodiment Seven. The amplifier in embodiment six, wherein the matching network comprises a reactance network and a transformer. The reactance network presents a short circuit or a virtual short circuit between the collector terminal and the emitter terminal at one or more harmonic frequencies. The transformer transforms the resistance of the electrical load to a second resistance at the two input terminals of the matching network. The second resistance is configured to maintain the collector voltage to be greater than the saturation voltage over the entire cycle of the sinusoidal voltage that is applied between the base terminal and the emitter terminal.

Embodiment Eight. The amplifier in embodiments six and/or seven, wherein the transformer has a primary winding of N1 turns and a secondary winding of N2 turns configured to transform the resistance of the electrical load to the second resistance of value $(N1/N2)^2 RL$ ohms, where N1 and N2 are natural numbers.

Embodiment Nine. The amplifier in embodiments six and/or seven, wherein the transformer is an N section quarter-wave transmission line transformer configured to transform the resistance of the electrical load o the second resistance, where N is a natural number.

Embodiment Ten. An amplifier comprises a Field Effect Transistor (FET), a bias network, an electrical load, and a matching network. The FET has a gate terminal, a source terminal, and a drain terminal. The FET deviates from hard saturation, in which a drain current that is a current flowing through the drain terminal deviates from a drain saturation current when a drain voltage that is a voltage from the drain terminal to the source terminal is greater than a saturation voltage. The saturation voltage is a voltage at which pinchoff first occurs. The bias network is configured to provide a DC voltage from the drain terminal to the source terminal. The electrical load has a resistance of value RL ohms. The electrical load has two input terminals. The matching network has two input terminals and two output terminals. One of the input terminals is connected to the drain terminal, and the other input terminal is connected to the source terminal. Each of the output terminals is connected to one of the two input terminals of the electrical load. The matching network is configured to present an impedance at the drain terminal and the source terminal, such that when a sinusoidal voltage is applied between the gate terminal and the source terminal. The train voltage is maintained at a voltage that is greater than the saturation voltage over an entire cycle of the sinusoidal voltage. The amplifier further comprises a means for isolating the DC voltage from the matching network, such that the deviation from linearity will be minimized when a sinusoidal voltage is applied between the gate terminal and the source terminal.

Embodiment Eleven. The amplifier in embodiment Ten, wherein the matching network comprises a reactance network and a transformer. The reactance network presents a short circuit or a virtual short circuit between the drain terminal and the source terminal at one or more harmonic frequencies. The transformer transforms the resistance of the electrical load to a second resistance at the two input terminals of the matching network. The second resistance is configured to maintain the drain voltage to be greater than the saturation voltage over the entire cycle of the sinusoidal voltage that is applied between the gate terminal and the source terminal.

Embodiment Twelve. The amplifier in embodiments ten and/or eleven, wherein the transformer has a primary winding of N1 turns and a secondary winding of N2 turns configured to transform the resistance of the electrical load to the second resistance of value $(N1/N2)^2 RL$ ohms, where N1 and N2 are natural numbers.

Embodiment Thirteen. The amplifier in embodiments ten and/or eleven, wherein the transformer is an N section quarter-wave transmission line transformer configured to transform the resistance of the electrical load to the second resistance, where N is a natural number.

Embodiment Fourteen. The amplifier in embodiments ten through thirteen, wherein the FET is from a family of FETs comprising an n-type JFET, p-type JFET, MESFET, MOSFET, NMOSFET, PMOSFET NMOSFET, MNOSFET, DIGMOSFET, HIGFET, TFET, HEMPT, or CMOSFET. The FET is an enhancement type of transistor or a depletion mode type of transistor.

Embodiment Fifteen. An amplifier comprises a Bipolar Junction Transistor (BJT), a bias network, an electrical load, and a matching network. The BJT has a base terminal, an emitter terminal, and a collector terminal. The BJT deviates from hard saturation, in which a collector current that is a current flowing through the collector terminal deviates from a collector saturation current when a collector voltage that is a voltage from the collector terminal to the emitter terminal is greater than a saturation voltage. The saturation voltage is a voltage at which pinchoff first occurs. The bias network is configured to provide a DC voltage from the collector terminal to the emitter terminal. The electrical load has a resistance of value RL ohms. The electrical load has two input terminals. The matching network has two input terminals and two output terminals. One of two inputs is connected to the collector terminal, and the other input terminal is connected to the emitter terminal. Each of the two output terminals is connected to one of the two input terminals of the electrical load. The matching network is configured to present an impedance at the collector terminal and the emitter terminal, such that when a sinusoidal voltage is applied between the base terminal and the emitter terminal, the collector voltage is maintained at a voltage that is greater than the saturation voltage over an entire cycle of the sinusoidal voltage. The amplifier further comprises a means for isolating the DC voltage from the matching network, such that the deviation from linearity will be minimized, when a sinusoidal voltage is applied between the base terminal and the emitter terminal.

Embodiment Sixteen. The amplifier in Embodiment Fifteen, wherein the matching network comprises a reactance network and a transformer. The reactance network presents a short circuit or a virtual short circuit between the collector terminal and the emitter terminal at one or more harmonic frequencies. The transformer transforms the resistance of the electrical load to a second resistance at the two input terminals of the matching network. The second resistance is configured to maintain the collector voltage to be greater than the saturation voltage over the entire cycle of the sinusoidal voltage that is applied between the base terminal and the emitter terminal.

Embodiment Seventeen. The amplifier in Embodiment fifteen and/or sixteen, wherein the transformer has a primary winding of N1 turns and a secondary winding of N2 turns configured to transform the resistance of the electrical load to the second resistance of value $(N1/N2)^2 RL$ ohms, where N1 and N2 are natural numbers.

Embodiment Eighteen. The amplifier in Embodiment fifteen and/or sixteen, wherein the transformer is an N section quarter-wave transmission line transformer configured to transform the resistance of the electrical load to the second resistance, where N is a natural number.

Although the description above contains many specific examples, these should not be construed as limiting the scope of the invention by merely providing illustrations of some of the presently preferred embodiments of this invention.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. An amplifier comprising:
a Field Effect Transistor (FET), wherein the FET has a gate terminal, a source terminal, and a drain terminal, and the FET has hard saturation in which a drain current flowing through the drain terminal is substantially constant when a drain voltage that is a voltage from the drain terminal to the source terminal is greater than a saturation voltage, the saturation voltage being a voltage at which pinchoff first occurs;
a bias network configured to provide a DC voltage from the drain terminal to the source terminal;
an electrical load having a resistance of value RL ohms, the electrical load having two input terminals;
a matching network having two input terminals, one of which is connected to the drain terminal and another one of which is connected to the source terminal, and having two output terminals, each of which is connected to one of the two input terminals of the electrical load, wherein the matching network is configured to present an impedance between the drain terminal and the source terminal, such that when a sinusoidal voltage is applied between the gate terminal and the source terminal, the drain voltage is maintained at a voltage that is greater than the saturation voltage over an entire cycle of the sinusoidal voltage; and a means for isolating the DC voltage from the matching network, wherein the drain current is not a function of the drain voltage and is a linear function of the sinusoidal voltage applied between the gate terminal and the source terminal.

2. The amplifier of claim 1, wherein the matching network comprises a reactance network and a transformer, the reactance network presents a short circuit or a virtual short circuit between the drain terminal and the source terminal at one or more harmonic frequencies, and the transformer transforms the resistance of the electrical load to a second resistance at the two input terminals of the matching network, the second resistance configured to maintain the drain voltage to be greater than the saturation voltage over the entire cycle of the sinusoidal voltage that is applied between the gate terminal and the source terminal.

3. The amplifier of claim 2, wherein the transformer has a primary winding of N1 turns and a secondary winding of N2 turns configured to transform the resistance of the electrical load to the second resistance of value $(N1/N2)^2 RL$ ohms, the second resistance configured to maintain the drain voltage to be greater than the saturation voltage over the entire cycle of the sinusoidal voltage that is applied between the gate terminal and the source terminal.

4. The amplifier of claim 2, wherein the transformer is an N section quarter-wave transmission line transformer, configured to transform the resistance of the electrical load to the second resistance, the second resistance configured to maintain the drain voltage to be greater than the saturation voltage over the entire cycle of the sinusoidal voltage that is applied between the gate terminal and the source terminal.

5. The amplifier of claim 1, wherein the FET is selected from a family of FETs comprising an n-type JFET, p-type JFET, MESFET, MOSFET, PMOSFET NMOSFET, MNOSFET, DIGMOSFET, HIGFET, TFET, or HEMPT; and
wherein the FET is an enhancement type of transistor, or a depletion mode type of transistor.

6. An amplifier comprising:
a Bipolar Junction Transistor (BJT), wherein the BJT has a base terminal, an emitter terminal, and a collector terminal, and the BJT has hard saturation in which a collector current flowing through the collector terminal is substantially constant when a collector voltage that is a voltage from the collector terminal to the emitter terminal is greater than a saturation voltage, the saturation voltage being a voltage at which saturation first occurs;
a bias network configured to provide a DC voltage from the collector terminal to the emitter terminal;
an electrical load having a resistance of value RL ohms, the electrical load having two input terminals;
a matching network having two input terminals, one of which is connected to the collector terminal and another of which is connected to the emitter terminal, and having two output terminals, each of which is connected to one of the two input terminals of the electrical load, wherein the matching network is configured to present an impedance between the collector terminal and the emitter terminal, such that when a sinusoidal voltage is applied between the base terminal and the emitter terminal, the collector voltage is maintained at a voltage that is greater than the saturation voltage over an entire cycle of the sinusoidal voltage; and a means for isolating the DC voltage from the matching network, wherein the collector current is not a function of the collector voltage and is a linear function of the sinusoidal voltage applied between the base terminal and the emitter terminal.

7. The amplifier of claim 6, wherein the matching network comprises a reactance network and a transformer, the reactance network presents a short circuit or a virtual short circuit between the collector terminal and the emitter terminal at one or more harmonic frequencies, and the transformer transforms the resistance of the electrical load to a second resistance at the two input terminals of the matching network, the second resistance configured to maintain the collector voltage to be greater than the saturation voltage over the entire cycle of the sinusoidal voltage that is applied between the base terminal and the emitter terminal.

8. The amplifier of claim 7, wherein the transformer has a primary winding of N1 turns and a secondary winding of N2 turns configured to transform the resistance of the electrical load to the second resistance of value $(N1/N2)^2 RL$ ohms, the second resistance configured to maintain the collector voltage to be greater than the saturation voltage over the entire cycle of the sinusoidal voltage that is applied between the base terminal and the emitter terminal.

9. The amplifier of claim 7, wherein the transformer is an N section quarter-wave transmission line transformer configured to transform the resistance of the electrical load to the second resistance, the second resistance configured to maintain the collector voltage to be greater than the saturation voltage over the entire cycle of the sinusoidal voltage that is applied between the base terminal and the emitter terminal.

10. An amplifier comprising:
a Field Effect Transistor (FET) wherein the FET has a gate terminal, a source terminal, and a drain terminal, and the FET deviates from hard saturation, in which a drain current that is a current flowing through the drain terminal deviates from a drain saturation current when a drain voltage that is a voltage from the drain terminal to the source terminal is greater than a saturation voltage, the saturation voltage is a voltage at which pinchoff first occurs;
a bias network configured to provide a DC voltage from the drain terminal to the source terminal;
an electrical load having a resistance of value RL ohms, the electrical load having two input terminals;
a matching network having two input terminals, one of which is connected to the drain terminal and another one of which is connected to the source terminal, and having two output terminals, each of which is connected to one of the two input terminals of the electrical load, wherein the matching network is configured to present an impedance between the drain terminal and the source terminal, such that when a sinusoidal voltage is applied between the gate terminal and the source terminal, the drain voltage is maintained at a voltage that is greater than the saturation voltage over an entire cycle of the sinusoidal voltage; and
a means for isolating the DC voltage from the matching network, wherein a deviation from linearity will be minimized, when a sinusoidal voltage is applied between the gate terminal and the source terminal.

11. The amplifier of claim 10, wherein the matching network comprises a reactance network and a transformer, where the reactance network presents a short circuit or a virtual short circuit between the drain terminal and the source terminal at one or more harmonic frequencies, and the transformer transforms the resistance of the electrical load to a second resistance at the two input terminals of the matching network, the second resistance configured to maintain the drain voltage to be greater than the saturation voltage over the entire cycle of the sinusoidal voltage that is applied between the gate terminal and the source terminal.

12. The amplifier of claim 11, wherein the transformer has a primary winding of N1 turns and a secondary winding of N2 turns configured to transform the resistance of the electrical load to the second resistance of value $(N1/N2)^2 RL$ ohms, the second resistance configured to maintain the collector voltage to be greater than the saturation voltage over the entire cycle of the sinusoidal voltage that is applied between the base terminal and the emitter terminal.

13. The amplifier of claim 11, wherein the transformer is an N section quarter-wave transmission line transformer configured to transform the resistance of the electrical load to the second resistance, the second resistance configured to maintain the collector voltage to be greater than the saturation voltage over the entire cycle of the sinusoidal voltage that is applied between the base terminal and the emitter terminal.

14. The amplifier of claim 10, wherein the FET is from a family of FETs comprising an n-type JFET, p-type JFET, MESFET, MOSFET, PMOSFET NMOSFET, MNOSFET, DIGMOSFET, HIGFET, TFET, or HEMPT; and
wherein the FET is an enhancement type of transistor, or a depletion mode type of transistor.

15. An amplifier comprising:
a Bipolar Junction Transistor (BJT), wherein the BJT has a base terminal, an emitter terminal, and a collector terminal, and the BJT deviates from hard saturation, in which a collector current that is a current flowing through the collector terminal deviates from a collector saturation current when a collector voltage that is a voltage from the collector terminal to the emitter terminal is greater than a saturation voltage, the saturation voltage is a voltage at which pinchoff first occurs;
a bias network configured to provide a DC voltage from the collector terminal to the emitter terminal;
an electrical load having a resistance of value RL ohms, the electrical load having two input terminals;
a matching network having two input terminals, one of which is connected to the collector terminal and another one of which is connected to the emitter terminal, and having two output terminals, each of which is connected to one of the two input terminals of the electrical load, wherein the matching network is configured to present an impedance between the collector terminal and the emitter terminal, such that when a sinusoidal voltage is applied between the base terminal and the emitter terminal, the collector voltage is maintained at a voltage that is greater than the saturation voltage over an entire cycle of the sinusoidal voltage; and a means for isolating the DC voltage from the matching network, wherein a deviation from linearity will be minimized, when a sinusoidal voltage is applied between the base terminal and the emitter terminal.

16. The amplifier of claim 15, wherein the matching network comprises a reactance network and a transformer, the reactance network present a short circuit or a virtual short circuit between the collector terminal and the emitter terminal at one or more harmonic frequencies, and the transformer transforms the resistance of the electrical load to a second resistance at the two input terminals of the matching network, the second resistance configured to maintain the collector voltage to be greater than the saturation voltage over the entire cycle of the sinusoidal voltage that is applied between the base terminal and the emitter terminal.

17. The amplifier of claim 16, wherein the transformer has a primary winding of N1 turns and a secondary winding of N2 turns configured to transform the resistance of the electrical load to the second resistance of value $(N1/N2)^2 RL$ ohms, the second resistance configured to maintain the collector voltage to be greater than the saturation voltage over the entire cycle of the sinusoidal voltage that is applied between the base terminal and the emitter.

18. The amplifier of claim 16, where the transformer is an N section quarter-wave transmission line transformer configured to transform the resistance of the electrical load to the second resistance, the second resistance configured to maintain the collector voltage to be greater than the saturation voltage over the entire cycle of the sinusoidal voltage that is applied between the base terminal and the emitter.

* * * * *